(12) United States Patent
Ware et al.

(10) Patent No.: US 11,914,888 B2
(45) Date of Patent: *Feb. 27, 2024

(54) MEMORY COMPONENT WITH INPUT/OUTPUT DATA RATE ALIGNMENT

(71) Applicant: Rambus Inc., San Jose, CA (US)

(72) Inventors: Frederick A. Ware, Los Altos Hills, CA (US); John Eric Linstadt, Palo Alto, CA (US); Torsten Partsch, San Jose, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/852,165

(22) Filed: Jun. 28, 2022

(65) Prior Publication Data

US 2023/0009384 A1    Jan. 12, 2023

Related U.S. Application Data

(63) Continuation of application No. 16/329,051, filed as application No. PCT/US2017/041248 on Jul. 7, 2017, now Pat. No. 11,403,030.

(Continued)

(51) Int. Cl.
*G06F 3/06* (2006.01)
*G06F 13/16* (2006.01)
(Continued)

(52) U.S. Cl.
CPC .......... *G06F 3/0655* (2013.01); *G06F 3/0604* (2013.01); *G06F 3/0679* (2013.01); *G06F 13/1668* (2013.01); *G11C 7/06* (2013.01); *G11C 7/1057* (2013.01); *G11C 7/106* (2013.01); *G11C 7/1066* (2013.01); *G11C 7/1087* (2013.01); *G11C 7/1093* (2013.01); *G11C 7/22* (2013.01); *G11C 11/4076* (2013.01);
(Continued)

(58) Field of Classification Search
CPC . G06F 3/06; G06F 7/10; G06F 3/0655; G06F 3/0604; G06F 3/0679
See application file for complete search history.

(56) References Cited

U.S. PATENT DOCUMENTS 5,671,392 A    9/1997  Parris et al.
5,913,046 A    6/1999  Barth et al.
(Continued)

FOREIGN PATENT DOCUMENTS

CN    1489153 A    4/2004

OTHER PUBLICATIONS

Extended European Search Report dated Mar. 25, 20 re: EP Appln. No. 17847125.6. 7 pages.
(Continued)

*Primary Examiner* — Henry Tsai
*Assistant Examiner* — Christopher A Daley
(74) *Attorney, Agent, or Firm* — Charles Shemwell

(57) ABSTRACT

First data is read out of a core storage array of a memory component over a first time interval constrained by data output bandwidth of the core storage array. After read out from the core storage array, the first data is output from the memory component over a second time interval that is shorter than the first time interval and that corresponds to a data transfer bandwidth greater than the data output bandwidth of the core storage array.

21 Claims, 10 Drawing Sheets

Related U.S. Application Data

(60) Provisional application No. 62/382,939, filed on Sep. 2, 2016.

(51) Int. Cl.

| | |
|---|---|
| *G11C 7/06* | (2006.01) |
| *G11C 7/10* | (2006.01) |
| *G11C 7/22* | (2006.01) |
| *G11C 11/4076* | (2006.01) |
| *G11C 11/4096* | (2006.01) |
| *H01L 25/065* | (2023.01) |

(52) U.S. Cl.
CPC ...... *G11C 11/4096* (2013.01); *H01L 25/0657* (2013.01); *G06F 2213/16* (2013.01); *G11C 7/1015* (2013.01); *G11C 2207/107* (2013.01); *G11C 2207/2272* (2013.01); *G11C 2207/2281* (2013.01); *G11C 2207/229* (2013.01); *H01L 2225/06541* (2013.01)

(56) References Cited

U.S. PATENT DOCUMENTS

| | | | |
|---|---|---|---|
| 6,278,648 B1 | 8/2001 | Cowles et al. | |
| 6,718,431 B2 | 4/2004 | Barth et al. | |
| 6,754,120 B1 | 6/2004 | Bellows et al. | |
| 6,825,841 B2 | 11/2004 | Hampel et al. | |
| 7,161,961 B2 | 1/2007 | Barker et al. | |
| 7,254,075 B2 | 8/2007 | Woo et al. | |
| 7,287,105 B1 | 10/2007 | Owen et al. | |
| 7,500,075 B1 | 3/2009 | Garrett, Jr. | |
| 7,598,768 B1 | 10/2009 | Tetzlaff et al. | |
| 8,151,044 B2 | 4/2012 | Proesbsting | |
| 8,190,808 B2 * | 5/2012 | Lai | G11C 8/12 365/230.03 |
| 8,595,459 B2 * | 11/2013 | Ware | G06F 3/0673 711/167 |
| 11,403,030 B2 * | 8/2022 | Ware | G11C 7/1087 |
| 2002/0112119 A1 | 8/2002 | Halbert et al. | |
| 2004/0151203 A1 | 8/2004 | Gulati et al. | |
| 2007/0260841 A1 | 11/2007 | Hampel et al. | |
| 2012/0287971 A1 | 11/2012 | Gower et al. | |
| 2013/0003475 A1 * | 1/2013 | Jenkins | G11C 7/1072 365/193 |
| 2013/0083611 A1 | 4/2013 | Ware et al. | |
| 2014/0092918 A1 | 4/2014 | Jost | |
| 2014/0099106 A1 | 4/2014 | Asmainis et al. | |
| 2014/0372711 A1 | 12/2014 | O'Connor et al. | |
| 2015/0106561 A1 | 4/2015 | Ware et al. | |
| 2015/0178187 A1 | 6/2015 | Sheffler et al. | |
| 2016/0041785 A1 | 2/2016 | Walker | |
| 2016/0082383 A1 | 3/2016 | Meirav et al. | |
| 2016/0092383 A1 | 3/2016 | Bains et al. | |

OTHER PUBLICATIONS

Notification Concerning Transmittal of International Preliminary Report on Patentability dated Mar. 14, 2019 re: Int'l Appln. No. PCT/US2017/041248. 8 Pages.

Notification of Transmittal of the International Search Report and the Written Opinion of the International Searching Authority, or the Declaration dated Sep. 29, 2017 re: Int'l Appln. No. PCT/US2017/041248. 17 Pages.

CN Office Action dated Sep. 26, 2022 re: CN Appln. No. 201780035329.3. 12 pages. (w/Translation).

* cited by examiner

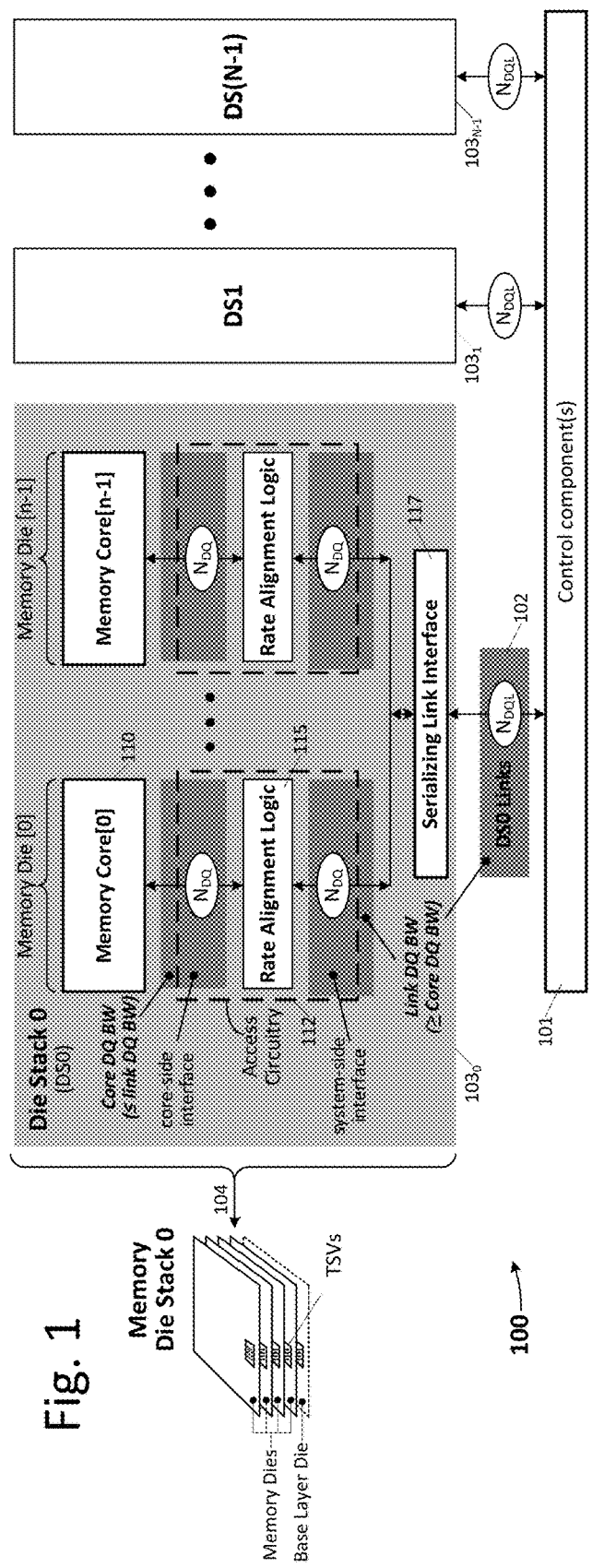
Fig. 1
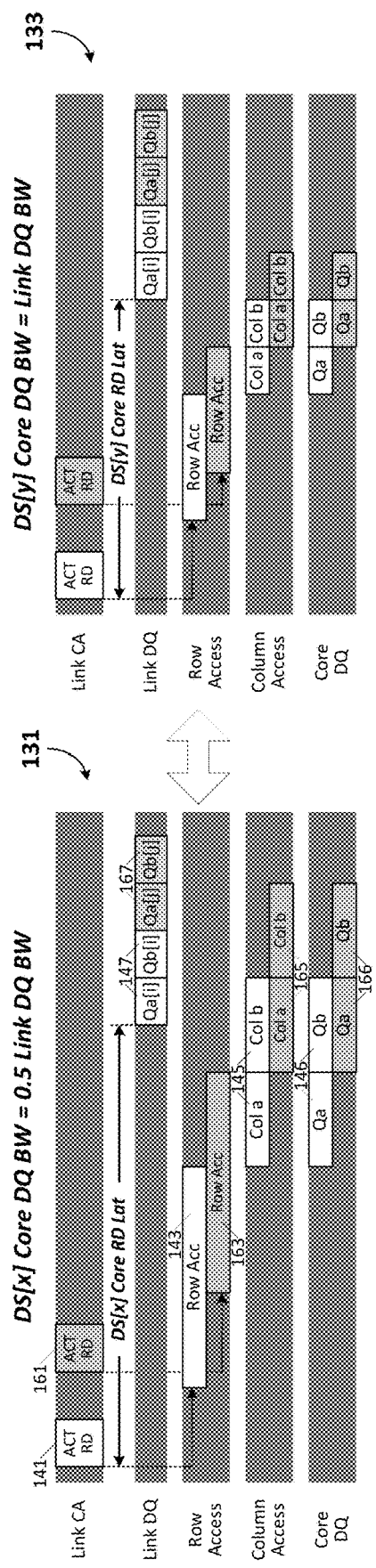
Fig. 2 Fixed Link Data-Rate/Non-uniform Core Data-Rates

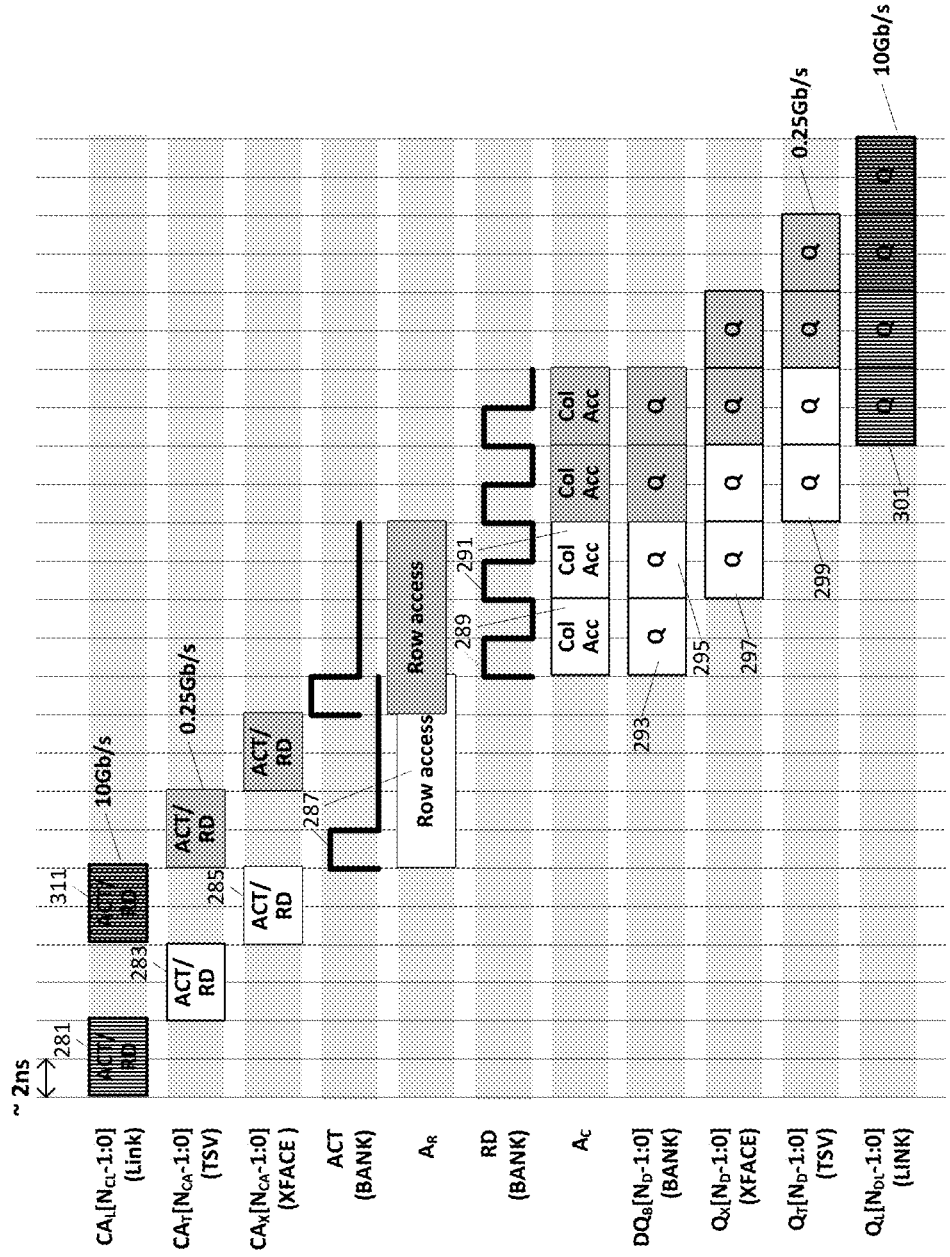

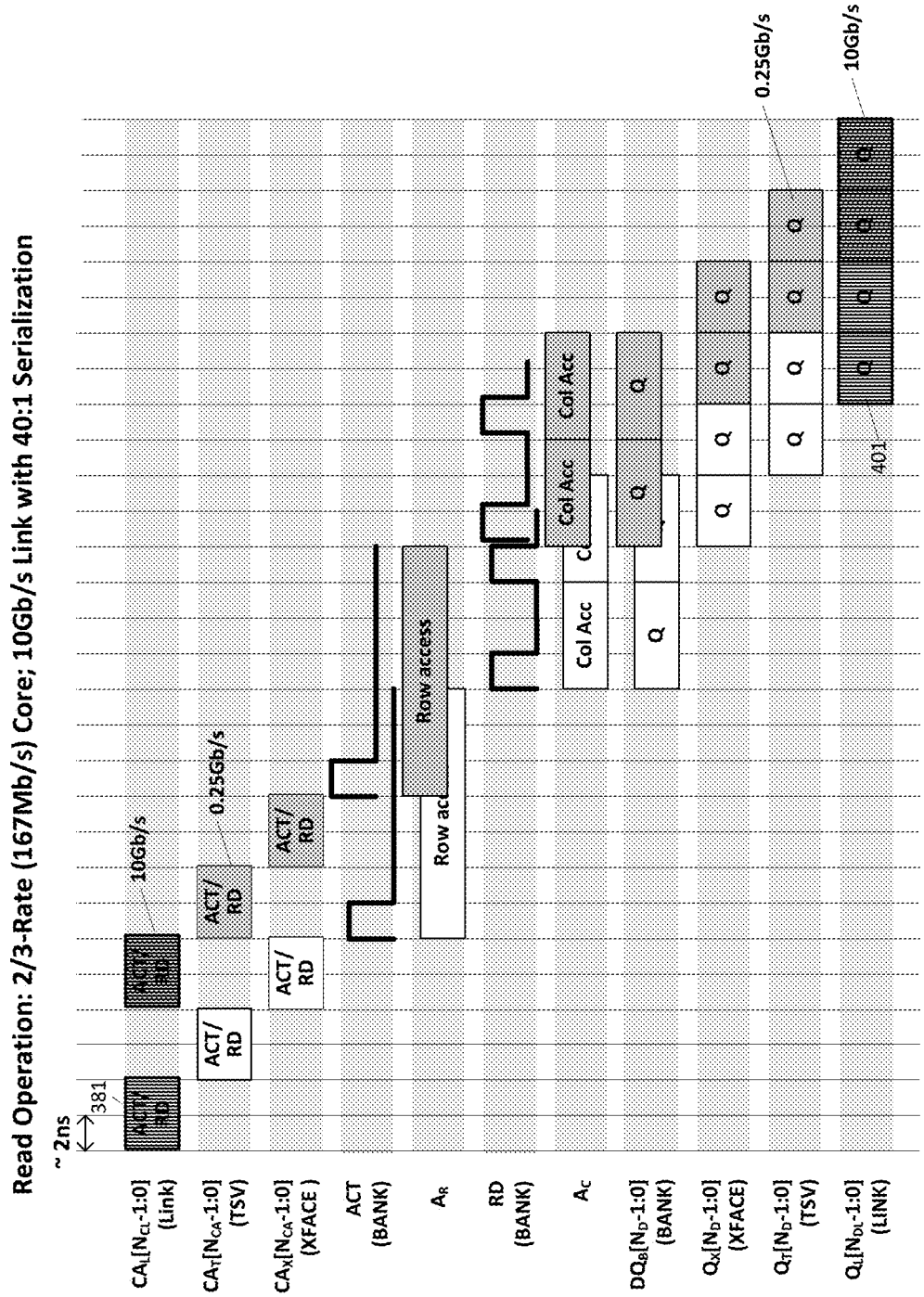

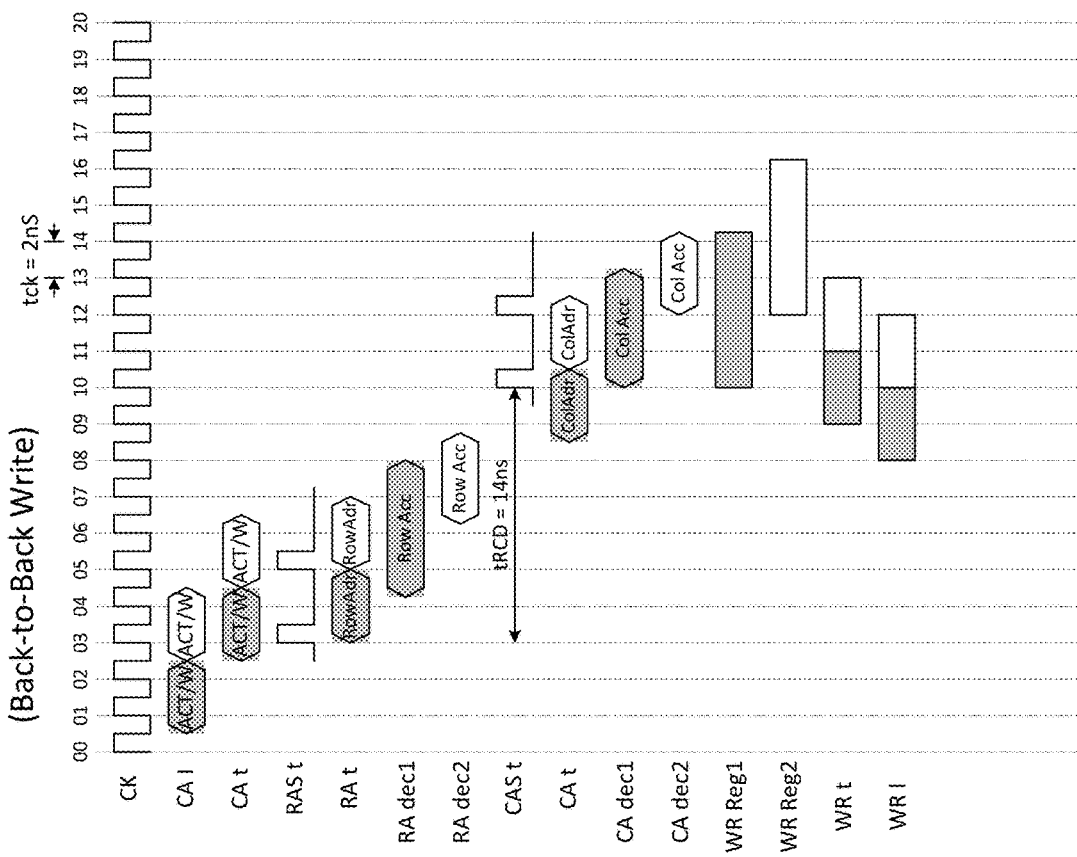
Fig. 7C (Back-to-Back Write)
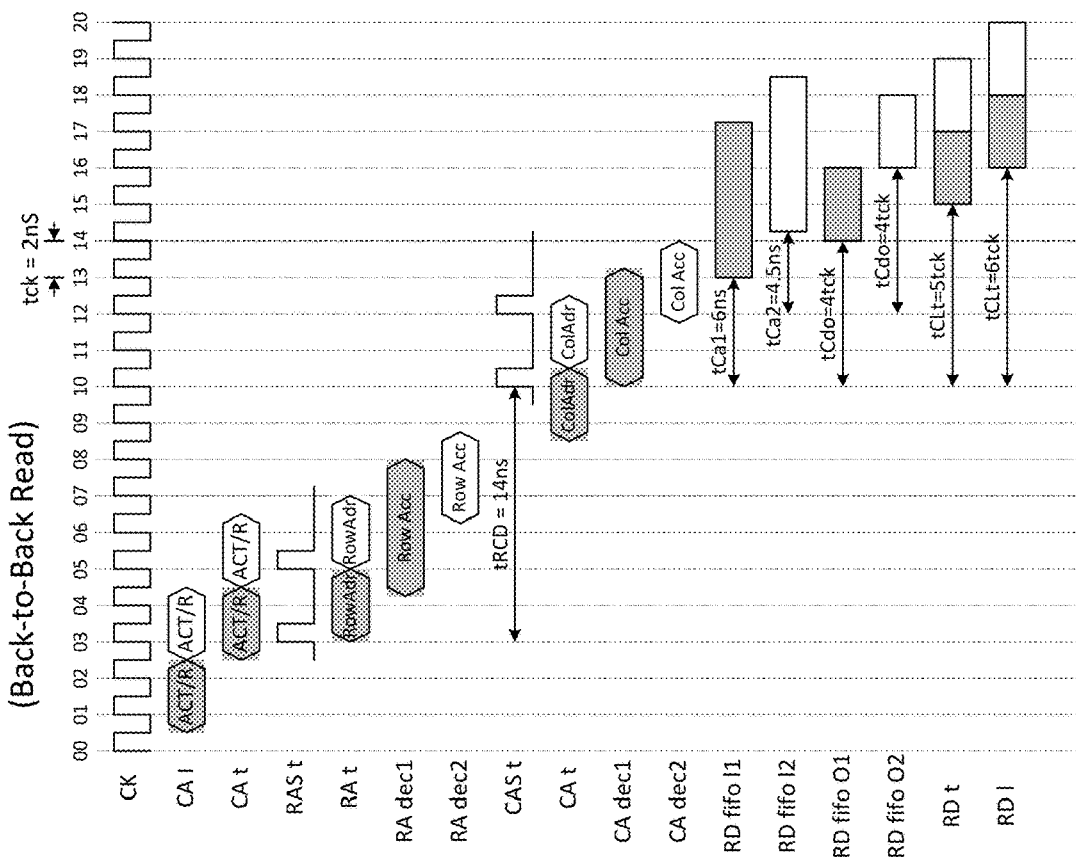
Fig. 7B (Back-to-Back Read)

(Back-to-Back Write to Read)

(Back-to-Back Read to Write)

MEMORY COMPONENT WITH INPUT/OUTPUT DATA RATE ALIGNMENT

CROSS REFERENCE TO RELATED APPLICATIONS

This application is a continuation of U.S. patent application Ser. No. 16/329,051 filed Feb. 27, 2019 (U.S. Pat. No. 11,403,030), which is a 35 U.S.C. § 371 U.S. National Stage of International Patent Application No. PCT/US2017/041248 filed Jul. 7, 2017, which claims the benefit of U.S. Provisional Patent Application No. 62/382,939 filed Sep. 2, 2016. Each of the above-referenced applications is hereby incorporated by reference.

TECHNICAL FIELD

The present disclosure relates to integrated-circuit data storage.

DRAWINGS

The various embodiments disclosed herein are illustrated by way of example, and not by way of limitation, in the figures of the accompanying drawings and in which like reference numerals refer to similar elements and in which:

FIG. 1 illustrates an exemplary computing system in which one or more control components are coupled to a memory subsystem via a plurality of signaling channels 102 each constituted by a number of data links and control links;

FIG. 2 contrasts exemplary memory access operations within memory die stacks 'x' and 'y' having non-uniform memory core bandwidths;

FIGS. 4A, 4B and 4C illustrate exemplary pipelined memory access operations for instances of the FIG. 3 memory component having different memory core rates;

Figure 7A:
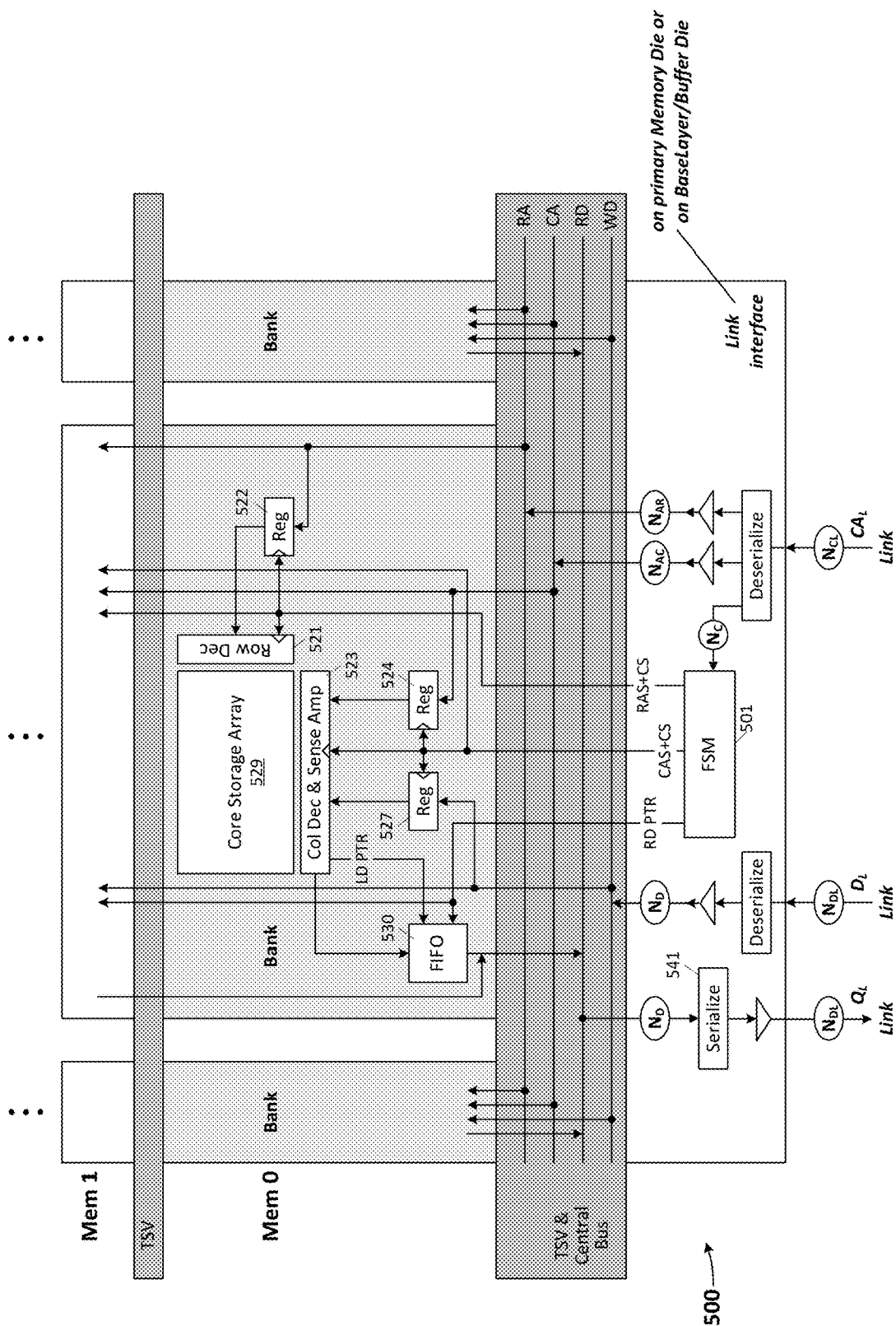
FIG. 7A illustrates an alternative rate-aligned memory component embodiment in which the memory core and rate alignment logic is managed asynchronously with respect to each constituent memory die, leveraging self-timing information from respective memory cores to determine when outbound (read) data is available from a given memory die.
Figure 7E:
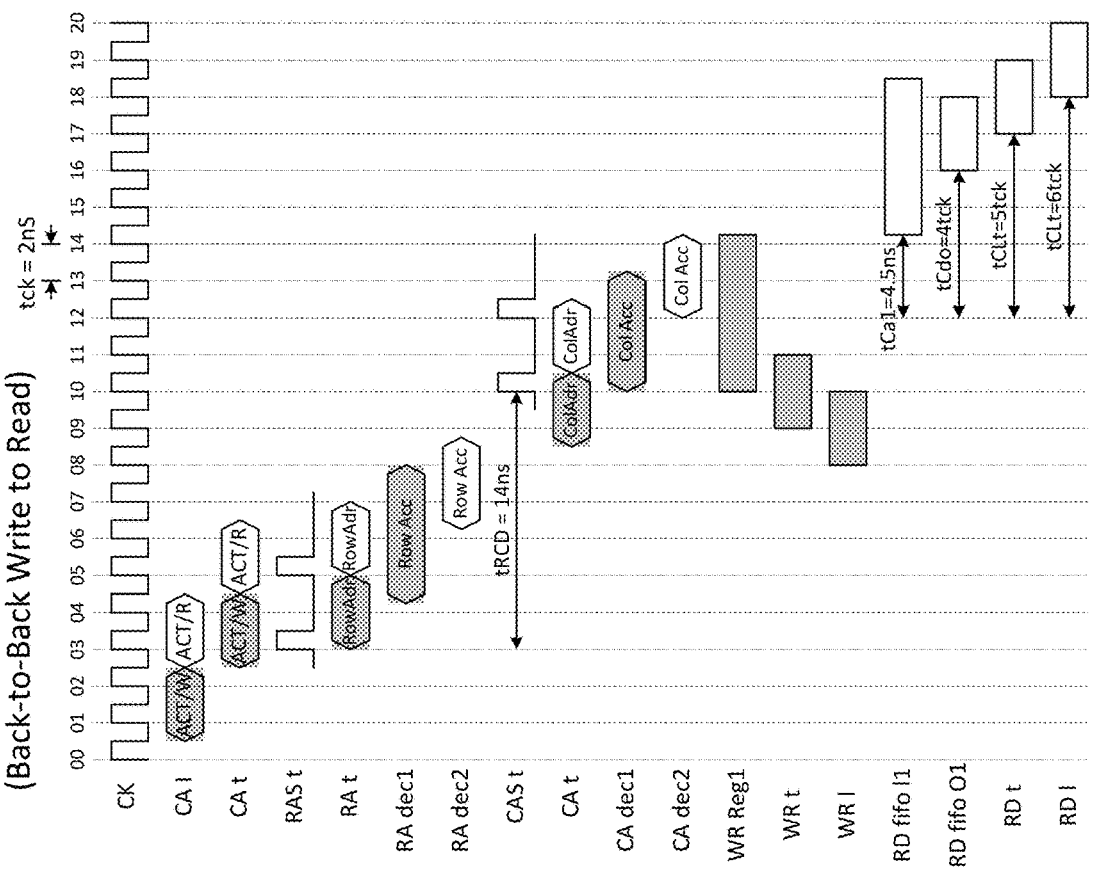
FIG. 7B illustrates an exemplary pair of activate/read operations within the memory die of FIG. 7A.
FIG. 7C illustrates an exemplary pair of activate/write operations within the memory die of FIG. 7A.
Figure 7D:
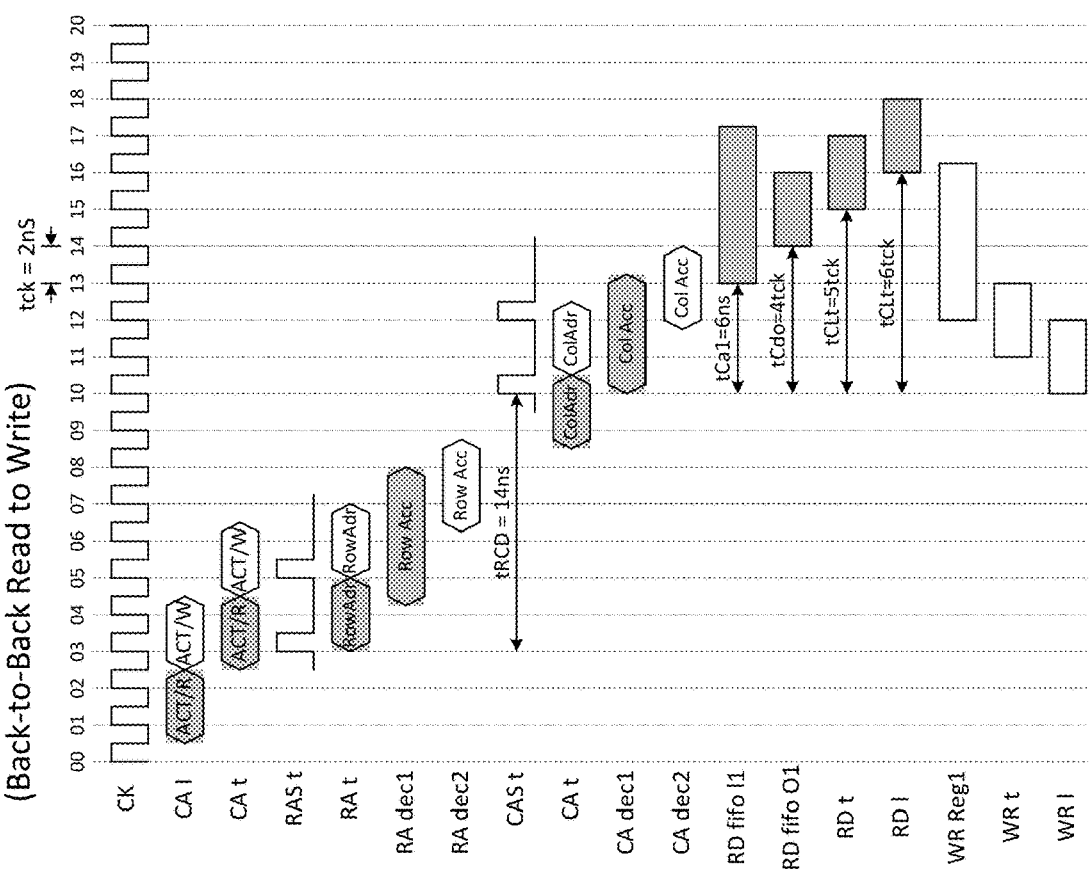
Figure 8:
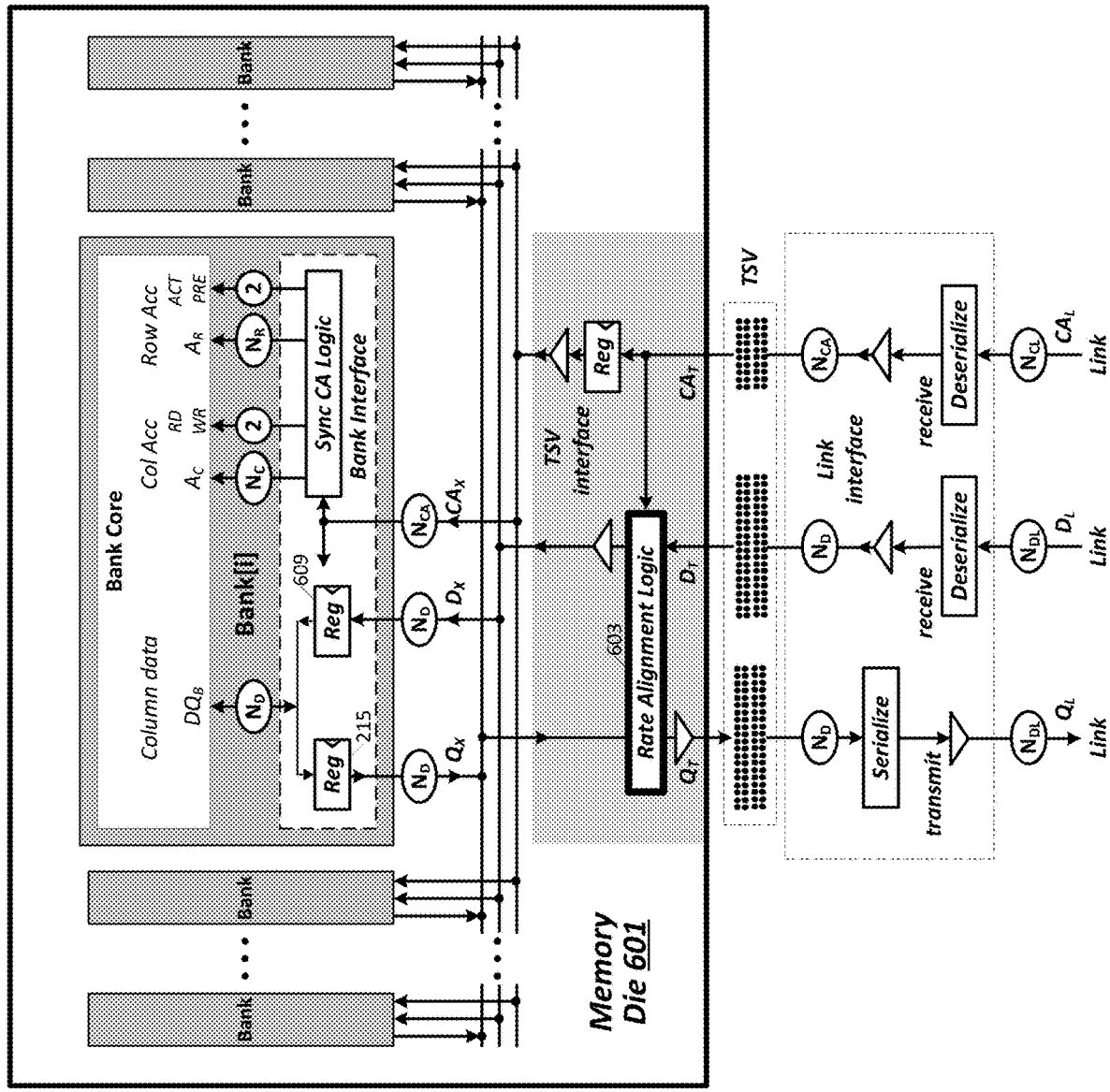

FIGS. 7D and 7E illustrate write after read operations and read after write operations, respectively, within the memory die of FIG. 7A, demonstrating contention free data transfer at the full bandwidth of the link interface, despite lower memory core bandwidths; and FIG. 8 illustrates an alternative memory die embodiment in which rate alignment logic is disposed at the TSV interface instead of in the bank interface.

DETAILED DESCRIPTION

In various embodiments disclosed herein, memory components implement data-rate transitions between their respective internal memory cores and fixed-rate external link interface circuitry to enable a memory component population with non-uniform memory core data rates to yield data throughput at the full bandwidth of the external signaling links. In a number of embodiments, for example, each memory component within a multi-component memory subsystem includes multiple memory dies with each memory die having multiple independently accessible memory banks. Rate alignment logic is provided with respect to each memory bank to enable data input/output (I/O) with respect to the various memory banks to be carried out at the full external interface rate of the memory component—the "link interface" rate—despite lower bandwidth access to the memory core of a given bank or banks. By this operation, data read/write access to different memory banks within the same memory component (or different memory dies within the same memory component or different memory components) may be executed back-to-back at the full bandwidth of the link interface without resource conflict. In other embodiments, rate alignment logic is provided at the link interface of a given memory component and shared among the constituent memory banks of the component so that back-to-back data read/write access may be carried out with respect to different memory dies within the same memory component (or different memory components), in effect limiting transactional concurrency to the memory die level (instead of the finer-grained bank level) in return for reduced rate-alignment overhead. Further, rate alignment logic may be implemented in conjunction with synchronous or asynchronous operation of the memory cores, with the latter permitting potentially reduced access latency and/or reduced timing overhead. These and other features and embodiments are discussed in greater detail below.

FIG. 1 illustrates an exemplary computing system in which one or more control components (collectively 101) are coupled to a memory subsystem via a plurality of signaling channels 102 each constituted by a number of data links ($N_{DQL}$) and control links (not specifically shown). The control component or components 101 may be implemented by any number of processor cores and optional switching circuitry that enables the processing cores to access any and all constituent memory components $103_0$-$103_{N-1}$ within memory subsystem 100.

Still referring to FIG. 1, individual memory components $103_0$-$103_{N-1}$ (referred to generically as memory component 103) are implemented by respective integrated-circuit (IC) packages having multiple memory dies and, optionally, a base layer/buffer die. In the particular embodiment shown at 104 and other examples shown and described below, the memory dies and base layer die are disposed in three-dimensional (3D) die-stack and interconnected by through-silicon vias (TSVs). A link interface (not specifically shown) is implemented in the base layer die and interconnected to a respective set of $N_{DQL}$ external signaling links 102. In all cases, constituent memory dies of a given memory component may be disposed in alternative topologies (e.g., one or more memory dies or groups of memory dies disposed adjacent another memory die or group of memory dies within an integrated circuit package) and interconnected by wire-bonding, flex cable or any other practicable interconnect technology instead of or in addition to TSVs. Also, the base layer (or buffer) die may be omitted and the link interface implemented instead on a "primary" memory die of the multi-die package. In that case, such primary memory die may be implemented differently than other "secondary" dies in a multi-die package (e.g., primary memory die having the link interface and other circuitry of the base layer die, while the secondary memory dies omit such circuitry) or all memory dies may be implemented identically, with the link interface being disabled on the secondary memory dies.

Referring now to the detailed view stacked-die memory component $103_0$, each of 'n' memory dies within a given die stack (or other multi-die package) includes a respective memory core 110 and access circuitry 112 interconnected by a number of core data lines ($N_{DQ}$) and core control signal lines (not specifically shown). The access circuitry within each memory die includes a system-side interface (in contradistinction to the core-side interface formed by the core data lines and control lines) coupled by TSVs and/or other interconnects to a shared link interface on a base layer die or primary memory die as discussed above. In the embodiment shown, access circuitry 112 within each memory die includes rate alignment logic 115 that raises (accelerates) the outgoing (read) data rate and reduces (decelerates) the incoming (write) data rate as necessary to mimic or emulate, at the system-side interface, a memory core operable at a data transfer bandwidth that matches the data transfer bandwidth of external memory links 102, thus enabling the core-side data rate (i.e., peak data transfer rate between memory core and rate alignment logic 115) to be less than or equal to the system-side data rate. Accordingly, even where the data transfer bandwidth of a memory core within a given die-stack is substantially lower than the link interface bandwidth, the rate-alignment logic equalizes the effective data rate of the memory core—for limited bursts of time—to that of the link interface. By this operation, and by interleaving memory accesses to concurrently accessible resources within the memory die stack (i.e., different memory banks within a memory core and/or different memory cores as discussed below), data transfer with respect to a given memory die stack may be carried out at the full bandwidth of the link interface (and thus at the full rate of the external signaling channel formed by links 102 and control component interface thereto) despite a memory core bandwidth below the link bandwidth. Moreover, a relatively large memory subsystem with tens, hundreds or more multi-die memory components 103 and respective sets of external signaling links 102 (e.g., 96 memory die stacks each coupled to control component(s) 101 via a respective set of $N_{DQL}$ signaling links and having four, eight or more constituent memory dies per stack) may be operated at the full external link signaling bandwidth despite non-uniform core bandwidths from die to die or memory component to memory component. Such operation is particularly beneficial where external link bandwidth is fixed at the control component domain (e.g., where the control components are operated at sub-cryogenic temperatures in which quantized power delivery establishes a uniform and not-easily adjustable timing domain within the control component(s)).

FIG. 2 contrasts exemplary memory access operations 131 and 133 within memory die stacks 'x' and 'y' having non-uniform memory core bandwidths. In the particular example shown, the memory core bandwidth within die-stack x is only half that of the external link bandwidth, while the core of die-stack y is twice as fast the die-stack x core and thus matches the external link bandwidth. Also, while the x and y die-stack memory cores (and other memory cores discussed below) are assumed to be dynamic random access memories (DRAMs) accessed through successive row (activation) and column access (read or write) operations, the memory cores may in all cases be implemented by any other memory technology (or combination of memory technologies) in alternative embodiments, including for example and without limitation, static random access memory (SRAM) cores and non-volatile memory cores of various types (e.g., Flash memory cores).

Referring first to diagram 131, a sequence of memory read accesses is carried out within die-stack x in response to control signals (including commands and addresses) conveyed via command/address links (not specifically shown in FIG. 1). More specifically, a row activation command/column read command directed to a first memory core within die-stack x is received at 141 (note that the row activation and column read commands may be received separately and sequentially in time, or in a unified command transfer as shown), and another row activation command/column read command directed to another memory core within the same die stack is received at 161. Each row-activation/column-read command triggers a respective row access 143, 163 (e.g., row activation in which contents of a row-address-selected row of storage cells are transferred to a sense amplifier bank to form an open "page" of data) followed by a respective pair of column access operations 145, 165 (e.g., each column access reading a column-address-selected column of data from the open page within the sense amplifier bank) in which respective columns of data (Qa/Qb) are transferred through the access circuitry to the link interface and then serialized therein for transfer over the external signaling links, 147, 167. As shown, data transfers over the core DQ lines at 146 and 166 (e.g., from the memory core to the access circuitry) take twice as long as corresponding data transfers 147 and 167 over the external signaling links—a consequence of the data-rate increase (rate-doubling in this example) effected by the rate alignment logic within die-stack x. That is, referring to FIG. 1, the data rate on the system side of the rate alignment logic (i.e., over the NDQ lines that connect a given memory die to the link interface) matches the data rate over the external signaling links and is double the data rate on the core-side data lines (i.e., the NDQ lines coupled between the rate alignment logic and the memory core).

Referring now to the memory access sequence shown within die-stack y (i.e., diagram 133), the same two memory access transactions are commanded and carried out, but at twice the core data rate of die stack x. Thus, the row activation operations with respect to each memory access takes substantially less time than in die-stack x (e.g., half as long, though somewhat more than half the die-stack x activation time due to core-rate independent timing delays) and the column read operations for each memory access take half as long as in die-stack x, matching the full-rate of the external-link data path.

Referring to FIGS. 1 and 2 and contrasting the die-stack x and die-stack y memory access transactions, the external-link data transfers occur at the same "link" data rate and thus, except for the longer overall die-stack-x access latency (i.e., time delay between arrival of row activation command and commencement of read data output at interface between the die stack and the external signaling links) owing to the half-rate die-stack x memory cores, reflect the same data throughput from the perspective of control component(s) 101. Accordingly, control component(s) 101 are enabled to receive read data from the various die-stacks at a uniform, fixed external-link data rate, but with varying latency according to the core rate of the die-stack subject to a given access or sequence of accesses. In one embodiment, for example, control component(s) 101 execute a training sequence with respect to each memory die stack to ascertain read latency (write latency may be assumed to be uniform from the host perspective even though internal data write operations may take longer in slower-core die-stacks), recording a read latency value for each die-stack within a register/lookup table and thereafter applying the read-latency value to determine data reception times for read data requested from a given memory die stack. In other embodiments, read latencies for respective memory die stacks may be ascertained by querying one or more nonvolatile memory elements provided with respect to an individual die stack or groups of die-stacks (e.g., as in a serial presence detect (SPD) memory), with the read latencies again being recorded within a run-time accessible register or lookup memory to determine die-stack specific read-data reception timing. In either case, the control component(s) may account for die-stack specific latency by delaying read data reception according to a predetermined or run-time determined number timing events (e.g., clock signal transitions) that are memory-component specific and synchronous with data transfer over external signaling links 102.

Figure 3:
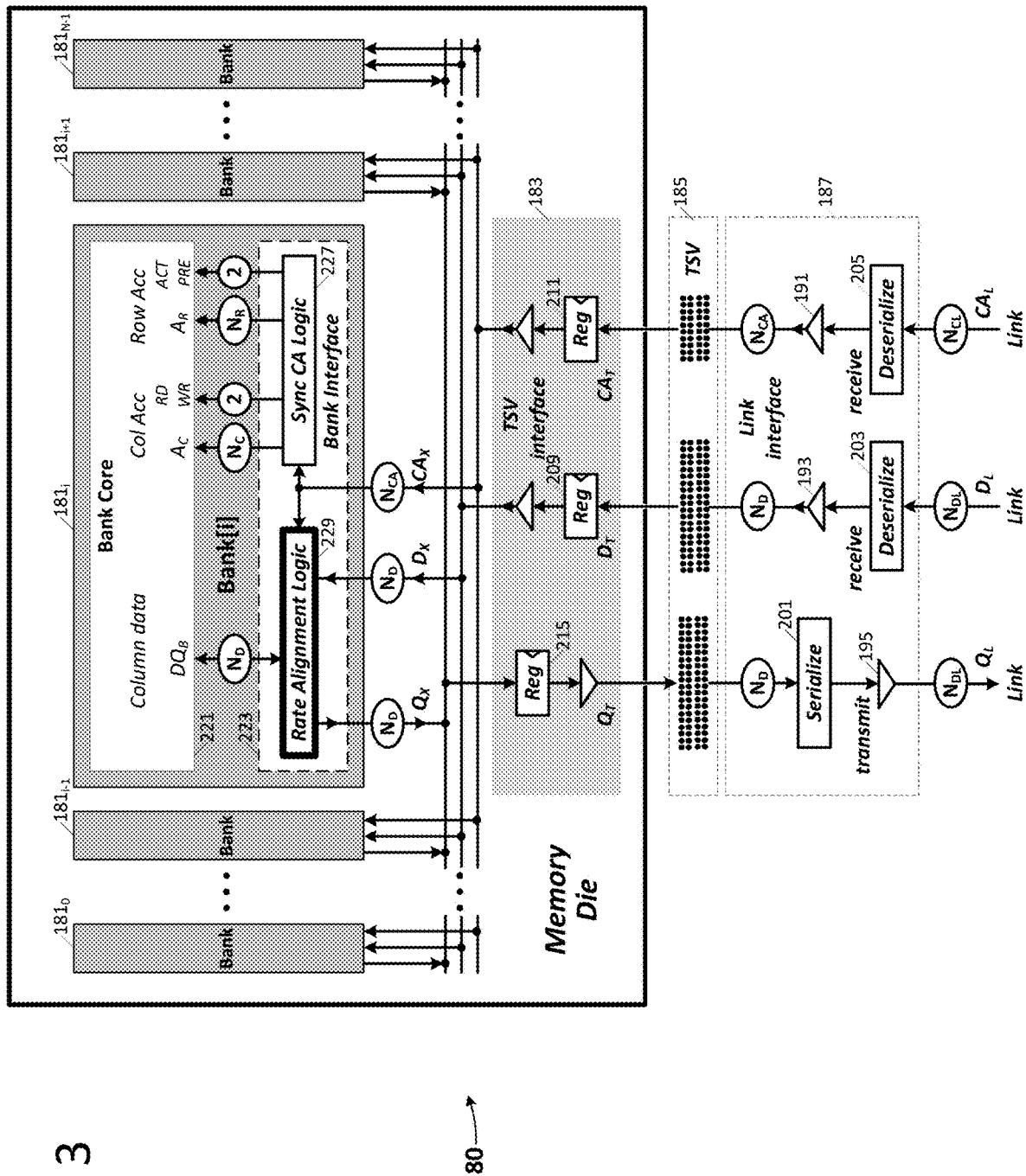
FIG. 3 illustrates an embodiment of a constituent memory die within the stacked-die memory components of FIG. 1.

FIG. 3 illustrates an embodiment of a constituent memory die 180 within the stacked-die memory components of FIG. 1. In the depicted example, memory die 180 includes a plurality of memory banks $181_0$-$181_{N-1}$ (each being referred to generically as bank 180 and having a bank interface and a core storage array) coupled to a TSV interface 183, with the TSV interface itself being coupled by TSVs 185 to a link interface 187 on a base-layer die or primary memory component (which may be part of memory die 180). More specifically, TSV interface 183 receives command/address signals from the link interface over a number ($N_{CA}$) of command/address signal lines and receives and outputs data over respective sets of read data lines ($N_D$) and write data lines ($N_D$), all of which are coupled directly or indirectly to counterpart signal receivers 191, 193 and output drivers 195 within the link interface. In general, signaling rates within TSV interface 187 are slower than those of counterpart external signaling links by a predetermined serialization/deserialization factor, with the bandwidth of the TSV interface matching that of the external signaling links by virtue of increased signal line count. In one embodiment, for example, each external signaling link conveys information (command/address/control signal over a $CA_L$ link read data signal over a $Q_L$ link, write data signal over a $D_L$ link) at 10 Gb/s (10 Gigabits per second), while each signal line between TSV interface 183 and the link interface 187 and each signal line between TSV interface 183 and the memory banks 181 conveys information at 0.25 Gb/s (exemplary transfer rates carried forward in examples below, although higher or lower rates may apply in all cases). Accordingly, to equalize the TSV interface bandwidth to that of the external signaling links, a 40:1 signal line ratio is implemented—that is, 40 signal lines enter and exit TSV interface 183 for every external signaling link and serialization/deserialization circuitry is provided within link interface 187 to serialize outgoing data (i.e., serializer 201 multiplexes respective bits from each of 40 TSV-connected signal lines into a burst of 40 bit intervals on an external signal link) and deserialize incoming data (deserializers 203 and 205 demultiplex respective bits from a 40-bit serial burst into a parallel set of 40 bits on respective TSV-connected signal lines). TSV interface 183 also receives or derives (e.g., through frequency division) one or more interface timing signals that cycle according to the maximum core clock rate or multiplier thereof (and thus, in this example, at 0.25 GHz or higher), passing the interface timing signals to the memory banks 181 and also clocking data into inbound registers 209, 211 and outbound register 215 of the TSV interface.

As shown with respect to memory bank $181_i$, each of memory banks 181 includes a memory bank "core" 221 and bank interface 223, with the latter coupled between the core and TSV interface 183. In one embodiment, each bank interface 223 includes command/address (CA) logic that synchronously issues row and column control signals and corresponding row and column addresses to the bank core (and storage array therein) to carry out row activation, column access (read and write), precharge and maintenance operations as signaled by the command/address information arriving via TSV interface 183. The incoming command/address information may also include various control and timing signals, including for example and without limitation, chip-select information (e.g., to enable the memory die to determine whether a requested row, column or maintenance operation is to be carried out with respect to one or more of its core storage arrays, or if the request is directed to a different memory die), the aforementioned interface timing signals, clock-enable signals, bus-inversion control signals, calibration control signals, error code (detection/correction) signals, and so forth.

Still referring to FIG. 3, each bank interface 223 also includes rate alignment logic 229 that multiplexes/serializes outbound data (raising the outbound data rate) and demultiplexes/deserializers inbound data (lowering the inbound data rate) as necessary to enable a slower core storage array to transfer data with respect to TSV interface 183 (and thus with respect to link interface 185) at the full bandwidth of the link interface. More specifically, rate alignment logic 229 operates in accordance with relative bandwidths of the core storage array and TSV interface to compact a relatively long core data retrieval interval into a shorter read data burst interval and conversely to expand a relatively compact write data burst into a longer core write interval in accordance with core timing constraints. In one implementation, discussed in greater detail below, the rate alignment logic 229 includes a state machine that operates at a sufficiently resolute clock rate (e.g., faster than the clock rate of the TSV interface) to buffer outbound read data for temporally-compacted burst output and to buffer incoming write data for temporally-extended output to the core storage array (e.g., as necessary to overwrite a column of data within an open page of the core storage array). As shown, command/address signals supplied to the synchronous command/address logic 227, or at least a subset thereof, are also provided to rate alignment logic 229 to enable the rate alignment logic to determine when a data transfer is to occur in a given direction and to carry out buffering/rate-increase or buffering/rate-decrease accordingly. The command/address signals supplied to the rate alignment logic may include the above-described interface timing signals, including one or more timing/clock signals for clocking the finite state machine or other control circuitry within the rate alignment logic.

Figure 4B:
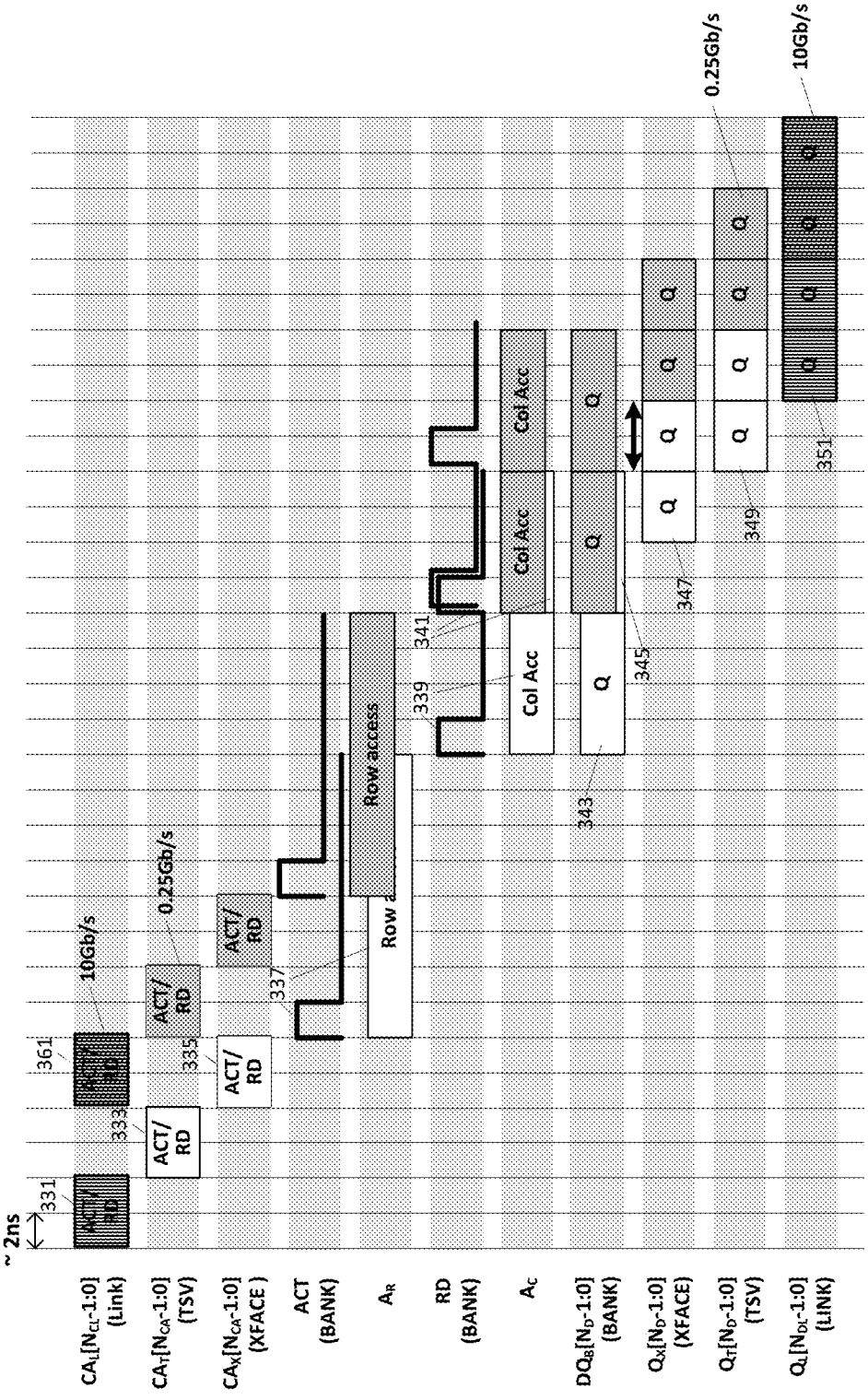

The dedicated rate-alignment logic 229 and command/address logic 227 within each memory bank in the embodiment of FIG. 3 enables memory access transactions directed to different banks to be pipelined at a rate that yields continuous data transfer at the full bandwidth of the TSV interface and external signaling links, despite a potentially slower memory core. FIGS. 4A, 4B and 4C illustrate such pipelined operation for different memory core rates, including overlapping bank access operations enabled by the dedicated bank resources (command/address and rate-alignment logic), in the context of full-rate, half-rate and ⅔-rate memory cores, respectively. Referring first to the full-rate memory core example of FIG. 4A (i.e., 250 Mb/s memory core is interfaced to a set of 10 Gb/s links with 40:1 read-data serialization), an activate/read command received within the external-link interface during an initial controller-perceived 4 nanosecond (ns) "core cycle" shown at 281 is stored within a TSV-interface register during the ensuing core cycle (283) and then within a register within the bank interface one core cycle later (285), in effect propagating from external link to TSV interface to bank interface in successive core cycles. A row activation operation 287 is commenced within an address-specified bank of a selected memory die in the core cycle that follows arrival of the activate/read command at the corresponding bank interface and extends, in this example, for 10 ns before back-to-back column read operations 289, 291 are commenced with respect to address-specified columns of the now-activated memory row (i.e., now-open memory page). In the embodiment shown and other examples presented below, the column read commands and column addresses that yield the successive memory read operations are conveyed in the initial activate/read CA signals (e.g., within the quantity (or packet or block or other unit) of command/address information shown at 281), though the column commands and addresses may alternatively be provided at a different time (e.g., predetermined time after receiving an activate command and address). In any case, application of the column address at 289 and again at 291 enables read data output from the memory core of the selected bank at 293 and 295, respectively, with the column read data propagating through respective registers within the bank interface (297) and TSV interface (299) before being serialized within the link interface and driven onto the external signaling links at 301. Because the memory core operates at the controller-perceived core cycle time (i.e., 250 Mb/s per core data line and thus at 10 Gb/s per external signaling link), the 4 ns data output time from the bank and storage time within the bank interface matches the 4 ns data storage interval within the TSV interface and 4 ns data burst time over the external signaling links. Also, even though the 10 ns row access (activation) interval for a given activate/read operation exceeds the combined 8 ns data output time back-to-back column read data transfers, execution of row activation operations in separate banks avoids resource conflict—that is, the two row activations may be carried out concurrently (at least partly overlapping in time) to maintain continuous (back-to-back without delay) column data output at the link interface. Thus, a successive activate/read command issued to a different bank at 311 (with corresponding/subsequent pipelined events indicated by shading) yields the same pipeline profile as activate/read command at 281, with temporally overlapping row activation operations in two different banks, but sequential and continuous data transmission in discrete (nonoverlapping) 4 ns pipestages through the TSV interface and over the external signaling links.

Referring now to the FIG. 4B half-rate memory core example (i.e., 125 Mb/s memory core interfaced to a set of 10 Gb/s links with the same 40:1 read-data serialization), as in FIG. 4A, an activate/read command received and stored within the link interface during an initial controller-perceived 4 ns "core cycle" at 331 (i.e., a 4 ns pipestage) is stored within a TSV-interface register during the ensuing pipestage 333 and then within a register within the bank interface one pipestage later 335. Also, as before, the activate/read command triggers a row activation at 337 within an address-specified row and memory bank, followed by a pair of column read operations 339, 341. Because of the reduced core rate, however, the row activation operation takes significantly longer than in the full-rate core example (16 ns vs the 10 ns in FIG. 4A), and each column access operation takes twice as long as in the full-rate core (8 ns per column access instead of 4 ns). Despite their extended durations, these bank-level row and column operations may be overlapped within the overall operational pipeline (i.e., due to dedicated bank resources and parallel operation therein), so that activate/read commands received at 331 and 361 and directed to respective memory banks trigger respective and temporally-overlapping time-staggered row activations and pairs of column access operations, before the 8 ns column data transfer intervals (e.g., 343, 345) are compacted (i.e., by the rate-alignment logic) at the system-side of the bank interface to enable pipelined, non-conflicting data transport from the system-side of the bank interface (347) through the TSV interface (349) and link interface (351). The extended row access and column access times are not without impact, however, as the overall read latency (i.e., from receipt of activate/read command at 331 to commencement of data output onto the external links at 351) grows accordingly—in this example by 14 ns relative to the latency of the full-rate core in FIG. 4A (i.e., an additional 6 ns for the row access and the additional 8 for the column access). Indeed, as discussed in further detail below, the rate alignment logic establishes the read data output time in accordance with the latency necessary to maintain uninterrupted output at the link interface. Thus, concurrent bank accesses are executed to maintain the data throughput with respect to the slow-core memory die at the full external-link data rate, albeit with extended latency.

FIG. 4C illustrates another partial-rate core example—in this case with a memory core rate that is two-thirds (⅔) the 250 Gb/s full-core rate and thus 167 Gb/s—to demonstrate the relatively continuous range of tolerable core rates between upper (100%) and lower (50%) corner cases. As in FIGS. 4A and 4B, an activate/read command received and stored within the link interface during an initial controller-perceived 4 ns core cycle (pipestage 381) is stored within a TSV-interface register during the ensuing pipestage and then within a register within the bank interface one pipestage later. As with the other core rates, the activate/read command triggers a row activation within an address-specified row and memory bank, followed by a pair of column read operations. Because of the less-than-full memory core rate, however, the row activation operation takes significantly longer than in the full-rate core example (14 ns vs the 10 ns in FIG. 4A), and the column access operation takes approximately 50% longer than the full-rate core (6 ns per column access instead of 4 ns). As explained in the half-rate-core example of FIG. 4B, these bank-level row and column operations are overlapped within the overall transaction pipeline, with each of the activate/read commands directed to respective memory banks triggering time-staggered row activations and column access operations on even pipestage intervals (i.e., two 4 ns pipestage intervals and thus 8 ns in the example shown), before the column data transfer interval is compacted (i.e., by the rate-alignment logic) at the system-side of the bank interface and successive pipestages within the TSV interface and link interface. The overall read latency (i.e., from receipt of activate/read command at 381 to commencement of data output onto the external links at 401) grows in accordance with the extended row and column operation times—in this example by 8 ns relative to the latency of the full-rate core in FIG. 4A (i.e., an additional 4 ns for the row access and an additional 2 ns for each of the two column accesses). As in the half-rate case, concurrent bank accesses are executed to maintain the control-side throughput of the slower-core memory die at the full-core data rate and the rate alignment logic establishes the read data output time in accordance with the latency necessary to maintain uninterrupted full-rate output at the link interface.

Figure 5A:
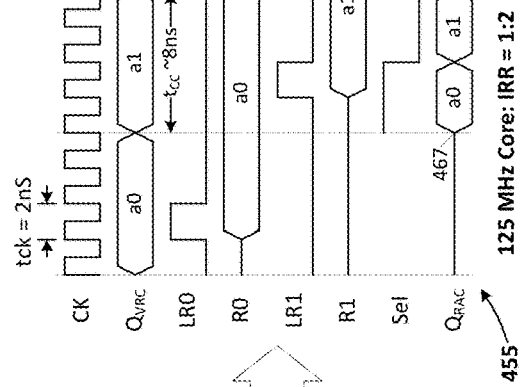
FIGS. 5A and 5B illustrate an exemplary implementation of outbound-data (read data) rate alignment logic and operation thereof.
Figure 5B:
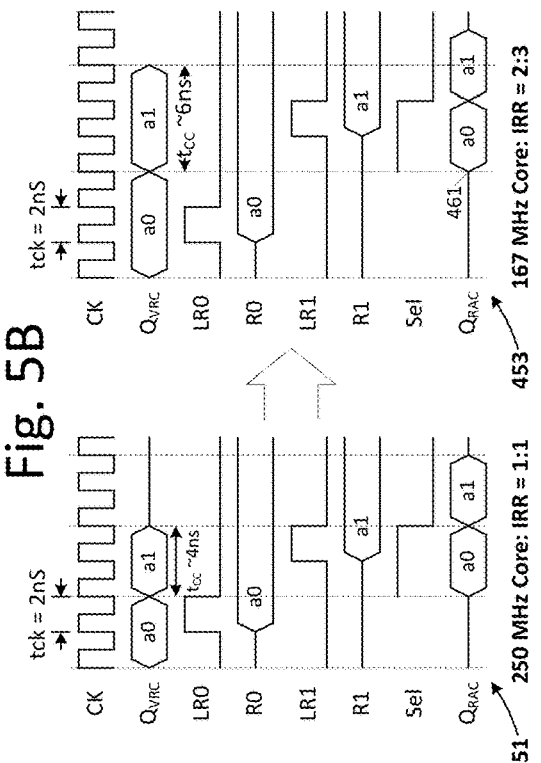

FIGS. 5A and 5B illustrate an exemplary implementation of outbound-data (read data) rate alignment logic 420 and operation thereof. Referring first to FIG. 5A, rate alignment logic 420 receives read data from a variable-rate domain (e.g., the memory core in the embodiment of FIG. 3) at a data rate falling anywhere between predetermined minimum and maximum (full-core) rates, and outputs data to a rate-aligned domain at the full-core data rate. Accordingly, "variable-rate domain" refers to a timing domain having a nominally fixed data rate (i.e., discounting variation due to voltage/temperature change, for example) falling arbitrarily between minimum and maximum (full-core) data rates.

Still referring to FIG. 5A, rate alignment logic 420 includes a pair of registers 421 and 423 (R0, R1) to alternately buffer core-supplied read data, a multiplexer 425 to alternately select registers 421 and 423 to source outgoing read data, and a finite state machine 427 (FSM) that responds to incoming commands within the command/address stream (CA) and an interface-rate ratio (IRR) value to load read data into registers 421, 423 and control the output selection of multiplexer 425. Finite state machine 427 also receives, as part of or in addition to the command/address signals, a control clock signal that oscillates at twice the full-rate core cycle time and thus with a 2 ns cycle time (500 MHz) in the example shown, though faster or slower control clocks may be used. FIG. 5B illustrates exemplary operation of rate-alignment logic 420 with respect to the control clock (CK), including the timing of register-load signals (LR0, LR1) and multiplexer control signal (Sel) issued by finite state machine 427, for each of the three exemplary core clock rates shown in FIGS. 4A-4C (i.e., full-core rate as in FIG. 4A, ⅔ rate as in FIG. 4C and half rate as in FIG. 4B). In the full-rate (250 MHz) core example at 451, the finite state machine asserts register load signals LR0 and LR1 at the midpoint of the 4 ns (full-rate column cycle time, $t_{CC}$) data-valid intervals of the variable-rate core data output, thus loading successively output data bits 'a0' and 'a1' into registers R0 and R1 in the clock. Multiplexer select signal, "Sel," is raised during the 4 ns pipestage interval that follows the R0 load operation, and then lowered during the ensuing 4 ns pipestage interval that follows the R1 load operation to output the a0 and a1 read data bits within the rate-aligned domain at the full core-rate. Note that while data bit flow through rate-alignment logic is described, the rate alignment circuitry may include registers and multiplexing circuitry for as many bit lanes as necessary to meet the subject interface width.

Still referring to FIG. 5B, in the ⅔-rate core example shown at 453 (i.e., having a 6 ns column cycle time), finite state machine 427 asserts register load signals LR0 and LR1 at the start of respective control clock cycles that follow the core data bit outputs (a0 and a1). Despite the relatively early availability of the a0 data bit, the finite state machine defers (delays) multiplexing the a0 data bit onto the rate-aligned interface until a time 461 that permits back-to-back output of the a0 and a1 data bits onto the rate-aligned interface (i.e., $Q_RAc$) for respective intervals that correspond to the full core rate (i.e., control-component-perceived 250 Mb/s core rate), in effect adding latency to the a0 bit output as necessary to compact the output bits into back-to-back full-core-rate transfer intervals (4 nS) within the rate-aligned domain. In the half-rate core example shown at 455 (i.e., $t_{CC}$=8 ns), finite state machine 427 similarly asserts register load signals at the control clock edges that follow the core data bit outputs and then delays multiplexing the a0 data bit to an even greater degree than in the ⅔ example (i.e., until 467 and thus by two core clock cycles instead of one) to yield back-to-back output of the a0 and a1 read data bits at the rate-aligned interface at the full core rate.

Figure 6A:
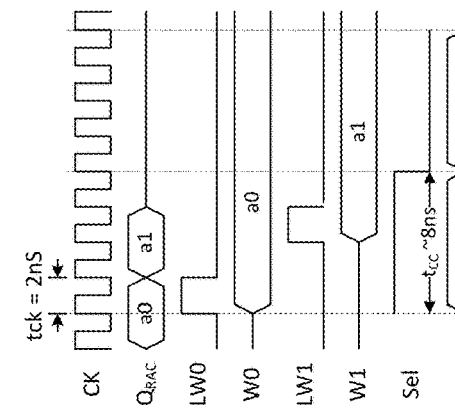
FIGS. 6A and 6B illustrate exemplary implementation of inbound-data (write data) rate alignment logic and operation thereof.
Figure 6B:
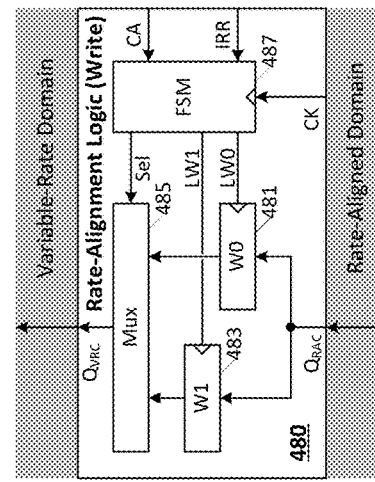

FIGS. 6A and 6B illustrate exemplary implementation of inbound-data (write data) rate alignment logic 480 and operation thereof. As in embodiments discussed above, inbound-data rate alignment logic 480 may be coupled in common with the outbound-data rate alignment logic to bidirectional data paths (i.e., read and write data progressing at different times through the same input/output (I/O) path), or dedicated read and write data paths may be provided. In either case, the inbound-data rate alignment logic includes an inbound register pair 481, 483, multiplexer 485 and finite state machine 487 (which may be implemented by the same registers, multiplexers and/or state machine as discussed above with respect to outbound-data rate alignment logic 420), and carries out essentially the reverse operations of the outbound—data rate alignment logic—expanding the data-valid interval of incoming write data bits as necessary to meet the core data rates in slower-core memory dies (compare the 4 ns, 6 ns and 8 ns $t_{CC}$ intervals shown in FIG. 6B).

As FIGS. 5B and 6B demonstrate, the control clock frequency establishes the granularity (resolution) with which the rate-alignment logic distinguishes different memory core rates—the faster the control clock, the greater the number of distinguishable timing scenarios and corresponding read-latency timing points reportable to the control components (i.e., reportable to component or components 101 as shown in FIG. 1). As faster control clocks generally demand greater power consumption, latency granularity may be compromised (i.e., constrained or limited) in a given computing system according to available power budget. FIG. 7A illustrates an alternative rate-aligned memory component embodiment 500 in which the memory core and rate alignment logic is managed asynchronously with respect to each constituent memory die, leveraging self-timing information from respective memory cores to determine when outbound (read) data is available from a given memory die and thus achieve the lowest possible output latency without driving up power consumption. In the exemplary implementation shown, a finite state machine 501 is provided within the link interface to issue row address strobe (RAS) and column address strobe (CAS) signals to each memory die within the die stack (i.e., "Mem 0," "Mem 1," . . . ) in accordance with incoming command/control signals (Nc), pairing the outgoing RAS and CAS signals with chip-select signals (CS) to enable a selected one of the memory dies to carry out the signaled row or column operation. Referring to the detail view of memory die 0 ("Mem 0"), deserialized row address signals and column address signals are routed to the row-address and column-address decode logic blocks (521, 523) for each memory bank ("Bank"), with the RAS and CAS signals sequentially triggering row activation within the core storage array and column read/write operation within the sense amplifier bank (including strobing row and column addresses into registers 522 and 524), respectively. As shown, the CAS signal additionally strobes write data into register 527 in a column write operation.

Still referring to FIG. 7A, self-timing signals from the memory core (e.g., signals output from asynchronous timing chains that mimic or approximate delays and/or replicate the circuits and signaling paths within the core storage array and sense amplifier bank) are supplied to a readout memory 530 operated as a first-in, first-out (FIFO) buffer. Accordingly, during a memory read operation, read data is pushed into FIFO 530 as soon as it becomes available, advancing a load pointer ("LD PTR") to mark the next available FIFO buffer storage element. Finite state machine 501 maintains a read pointer ("RD PTR") that points to the FIFO first storage element to supply data to the link interface during a column read operation and advances the read pointer to a FIFO storage element that is to supply data to the link interface after data from the first storage element has been serialized within the link interface (i.e., within outbound data serializer 541) and output from the memory component via the external signaling links. Through this asynchronous core management and FIFO loading, a continuous range of memory core rates (e.g., between predetermined minimum and maximum rates according to FIFO depth) may be accommodated without requirement for high resolution clocking within the bank interface. Moreover, because read data is made available within FIFO 530 at the instant indicated by the self-timed memory core, readout latency may be minimized in accordance with the subject memory core rate.

FIG. 7B illustrates an exemplary pair of activate/read operations within the memory die of FIG. 7A. As shown, activate/read commands directed to two different memory banks (on the same or different memory die of a given memory component) arrive via external command/address links (CA 1) in back-to-back 4 ns pipestage intervals and are deserialized and captured within the finite state machine (i.e., element 501 of FIG. 7A) during the ensuing pipestages. The finite state machine responds to the incoming activate/read commands by issuing RAS signals (RAS t) and corresponding row address signals (RA t) one after another to the respective memory banks (i.e., specified by bank addresses that accompany the activate/read commands). The RAS signal assertions enable row-address capture ("RowAdr") within the row-address registers of the chip-selected memory die and bank-address specified banks, followed by commencement of row access/activation operations ("Row Acc") within the respective banks. For purposes of example, the two memory banks are assumed to exhibit different timing characteristics (as may be the case between banks within the same memory die, different memory dies and different memory components). After an exemplary 14 ns RAS-to-CAS delay (tRCD), the finite state machine issues a sequence of CAS signals to latch column addresses within the column address registers of address-selected banks and to trigger column access operations (CA dec1, CA dec2). After bank-specific, self-timed column access intervals transpire (i.e., tCa1, tCa2), data corresponding to each of the column accesses is loaded into respective read-data FIFOs of the target memory banks (RD fifo 11, RD fifo 12), and the load pointer is advanced to identify the next-to-be loaded FIFO element in each memory bank. In one embodiment, the finite state machine unloads the FIFOs a predetermined time after the FIFO load operations (e.g., a fixed time according to a specified or run-time-determined bank access time, or in response to notification of the FIFO load operations), capturing the memory read data from each of the banks in succession within a register of read-data serializer within the link interface (element 541 of FIG. 7A) and then driving the read data onto the external signaling links. Accordingly, as in the embodiments of FIGS. 3-6B, the FIFO-based rate alignment logic enables data transfer at the full bandwidth of the link interface, despite lower memory core bandwidths in one or more memory components (or memory dies or memory banks) of the memory subsystem.

FIG. 7C illustrates an exemplary pair of activate/write operations within the memory die of FIG. 7A. In this case, activate/write commands directed to two different memory banks (on the same or different memory die of a given memory component) arrive via external command/address links (CA 1) in back-to-back 4 ns pipestage intervals and are deserialized and captured within the finite state machine (i.e., element 501 of FIG. 7A) during the ensuing pipestages. The finite state machine responds to the incoming activate/write commands by issuing RAS signals (RAS t) and corresponding row address signals (RA t) one after another to the respective memory banks (i.e., specified by bank addresses that accompany the activate/read commands). The RAS signal assertions enable row-address capture ("RowAdr") within the row-address registers of the chip-selected memory die and bank-address specified banks, followed by commencement of row access/activation operations ("Row Acc") within the respective banks. As in the examples above, the two memory banks are assumed to exhibit different timing characteristics as may be the case between banks within the same memory die, different memory dies and different memory components. After an exemplary 14 ns tRCD interval, the finite state machine issues a sequence of CAS signals to latch column addresses within the column address registers of address-selected banks and to trigger column access operations (CA dec1, CA dec2). After bank-specific, self-timed column access intervals transpire (i.e., tCa1, tCa2), write data received via the link interface and TSV interface with the timing shown at WR 1 and WR t (i.e., at the full bandwidth of the link interface) corresponding to each of the column accesses is loaded into respective write registers of the target memory banks (WR Reg1, WR Reg2), and written to the open memory page at the column offset established by the respective column addresses received within the activate write commands. Accordingly, the write-path rate alignment logic enables write data transfer at the full bandwidth of the link interface, despite lower memory core bandwidths in one or more memory components (or memory dies or memory banks) of the memory subsystem. FIGS. 7D and 7E similarly illustrate write after read operations and read after write operations, respectively, in different banks (i.e., mixing the operations shown and FIGS. 7B and 7C) within the memory die of FIG. 7A, demonstrating contention free data transfer at the full bandwidth of the link interface, despite lower memory core bandwidths in one or more memory components (or memory dies or memory banks) of the memory subsystem.

FIG. 8 illustrates an alternative memory die embodiment 601 in which rate alignment logic 603 (which may be a FIFO implementation as in FIGS. 7A and 7B) is disposed at the TSV interface instead of in the bank interface (e.g., displacing registers 209, 215 of the FIG. 3 embodiment which are instead disposed within the bank interface at 609, 615), in effect reducing the number of instances of the rate alignment logic (one instance per die instead of one instance per bank) in return for reduced granularity with respect to concurrent operations. That is, because core-side of rate alignment logic 603 receives and outputs data at the memory core rate (and thus possibly slower than the full link interface rate), otherwise temporally overlapping operations within different memory banks will conflict over data distribution lines Qx, Dx, thus limiting concurrency to operations on the system-side of the rate alignment logic and thus within different memory dies. Still, in memory components having stacks of eight, sixteen or more memory dies, operational concurrency may be sufficient to maintain peak data transfer rates with respect to the link interface (and endpoint control components) without the overhead of rate alignment circuitry within each bank interface.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, pixel array sizes, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. Timing edges, however depicted or described, may have rising-edge and/or falling-edge sensitivity in alternative embodiments (or be level sensitive), and active high or low logic levels may be reversed from those shown. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A memory component comprising:
   a first core storage array to provide successive sets of N data bits over successive core-readout intervals, respectively, N being a nonzero integer; and
   output circuitry to receive the successive sets of N data bits from the first core storage array and to output the successive sets of N data bits from the memory component over successive data-output intervals, respectively, each one of the data-output intervals being briefer than any one of the core-readout intervals.

2. The memory component of claim 1 further comprising an interface to receive one or more column read commands and wherein the first core storage array to provide the successive sets of N data bits comprises column-access circuitry to provide to the output circuitry, as the successive sets of N data bits, successive columns of data in response to the one or more column read commands, each one of the sets of N data bits constituting a respective one of the columns of data.

3. The memory component of claim 1 further comprising a second core storage array to provide additional successive sets of N data bits over a first time interval that is equal in duration to and temporally overlaps a second time interval spanned collectively by the successive core-readout intervals, and wherein the output circuitry comprises circuitry to receive the additional successive sets of N data bits from the second core storage array and to output the additional sets of N data bits from the memory component over a third time interval that is equal in duration to and immediately succeeds a fourth time interval spanned collectively by the successive data-output intervals.

4. The memory component of claim 3 wherein the memory component comprises at least one integrated-circuit memory die, and the first and second core storage arrays comprise respective first and second storage banks implemented within the at least one integrated-circuit memory die.

5. The memory component of claim 3 wherein the memory component comprises first and second integrated-circuit memory dies, the first core storage array comprises a first storage bank implemented within the first integrated-circuit memory die, and the second core storage array comprises a second storage bank implemented within the second integrated-circuit memory die.

6. The memory component of claim 1 wherein the output circuitry to output the successive sets of N data bits from the memory component comprises an M-bit wide synchronous signaling interface to output the successive sets of N data bits at a first data rate, M being a nonzero integer less than N.

7. The memory component of claim 6 wherein the first core storage array comprises an N-bit wide core interface to provide, to the output circuitry, the successive sets of N data bits from the first core storage at a second data rate that is lower than the first data rate.

8. The memory component of claim 7 wherein a multiplication product of M and the first data rate is greater than a multiplication product of N and the second data rate.

9. The memory component of claim 1 wherein the output circuitry to receive the successive sets of N data bits from the first core storage array and to output the successive sets of N data bits from the memory component over successive data-output intervals comprises first and second storage elements and circuitry that, with respect to each set of N data bits:
    stores a first portion of the set of N data bits in the first storage element and then stores a second portion of the set of N data bits in the second storage element; and
    delays output of the first portion of the set of N data bits from the memory component until the second portion of the set of N data bits is at least partly stored within the second storage element.

10. The memory component of claim 9 wherein the first and second storage elements comprises respective first and second elements of a first-in-first-out (FIFO) buffer, and the circuitry that stores the first and second portions of the set of N data bits within the first and second storage elements comprises circuitry to:
    store the first portion in the first storage element of the FIFO buffer;
    advance a load pointer indicative of an available storage element within the FIFO buffer to point to the second storage element thereof; and
    store the second portion in second storage element of the FIFO buffer in accordance with the load pointer.

11. A method of operation within a memory component having a first core storage array and output circuitry, the method comprising:
    providing successive sets of N data bits from the first core storage to the output circuitry over successive core-readout intervals, respectively, N being a nonzero integer; and
    outputting the successive sets of N data bits from the memory component via the output circuitry over successive data-output intervals, respectively, each one of the data-output intervals being briefer than any one of the core-readout intervals.

12. The method of claim 11 further comprising receiving one or more column read commands within the memory component and wherein providing the successive sets of N data bits from the first core storage array comprises providing, as the successive sets of N data bits, successive columns of data from the first core storage array in response to the one or more column read commands, each one of the sets of N data bits constituting a respective one of the columns of data.

13. The method of claim 11 further comprising:
    providing, to the output circuitry, additional successive sets of N data bits from a second core storage array of the memory component over a first time interval that is equal in duration to and temporally overlaps a second time interval spanned collectively by the successive core-readout intervals; and
    outputting the additional sets of N data bits from the memory component via the output circuitry over a third time interval that is equal in duration to and immediately succeeds a fourth time interval spanned collectively by the successive data-output intervals.

14. The method of claim 13 wherein the memory component comprises at least one integrated-circuit memory die, and the first and second core storage arrays comprise respective first and second storage banks implemented within the at least one integrated- circuit memory die.

15. The method of claim 13 wherein the memory component comprises first and second integrated-circuit memory dies, the first core storage array comprises a first storage bank implemented within the first integrated-circuit memory die, and the second core storage array comprises a second storage bank implemented within the second integrated-circuit memory die.

16. The method of claim 11 wherein outputting the successive sets of N data bits from the memory component via the output circuitry comprises outputting the successive sets of N data bits via an M-bit wide synchronous signaling interface at a first data rate, M being a nonzero integer less than N.

17. The method of claim 16 wherein providing the successive sets of N data bits from the first core storage to the output circuitry comprises providing the successive sets of N data bits to the output circuity via an N-bit wide data interface of the first core storage at a second data rate that is lower than the first data rate.

18. The method of claim 17 wherein a multiplication product of M and the first data rate is greater than a multiplication product of N and the second data rate.

19. The method of claim 11 wherein outputting successive sets of N data bits from the memory component via the output circuitry comprises, for each set of N data bits:
    storing a first portion of the set of N data bits in a first storage element of the output circuitry and then storing a second portion of the set of N data bits in a second storage element of the output circuitry; and
    delaying output of the first portion of the set of N data bits from the memory component until the second portion of the set of N data bits is at least partly stored within the second storage element.

20. The method of claim 19 wherein storing the first and second portions of the set of N data bits within the first and second storage elements comprises storing the first portion in a first storage element of a first-in-first-out (FIFO) buffer, advancing a load pointer indicative of an available storage element within the FIFO buffer to point to the second storage element and storing the second portion in second storage element of the FIFO buffer in accordance with the load pointer.

21. A memory component comprising:
    a first core storage array to provide successive sets of N data bits over successive core-readout intervals, respectively, N being a nonzero integer; and
    means for receiving the successive sets of N data bits from the first core storage array and for outputting the successive sets of N data bits from the memory component over successive data-output intervals, respectively, each one of the data-output intervals being briefer than any one of the core-readout intervals.

* * * * *